(12) United States Patent
Hsu

(10) Patent No.: US 8,472,265 B2
(45) Date of Patent: Jun. 25, 2013

(54) REPAIRING CIRCUIT FOR MEMORY CIRCUIT AND METHOD THEREOF AND MEMORY CIRCUIT USING THE SAME

(75) Inventor: Jen-Shou Hsu, Hsinchu (TW)

(73) Assignee: Elite Semiconductor Memory Technology Inc., Hsinchu (TW)

(*) Notice: Subject to any disclaimer, the term of this patent is extended or adjusted under 35 U.S.C. 154(b) by 188 days.

(21) Appl. No.: 13/104,038

(22) Filed: May 10, 2011

(65) Prior Publication Data

US 2012/0287737 A1 Nov. 15, 2012

(51) Int. Cl.
*G11C 7/06* (2006.01)
*G11C 29/00* (2006.01)
*G11C 17/18* (2006.01)
*G11C 8/00* (2006.01)

(52) U.S. Cl.
USPC ... 365/189.07; 365/200; 365/201; 365/225.7; 365/230.03

(58) Field of Classification Search
USPC ............ 365/189.07, 200, 201, 225.7, 230.03
See application file for complete search history.

(56) References Cited

U.S. PATENT DOCUMENTS

| | | | |
|---|---|---|---|
| 6,400,621 B2 * | 6/2002 | Hidaka et al. | 365/200 |
| 6,467,056 B1 * | 10/2002 | Satou et al. | 365/200 |
| 6,728,910 B1 * | 4/2004 | Huang | 365/200 |
| 7,602,659 B2 | 10/2009 | Kang | |

* cited by examiner

*Primary Examiner* — Trong Phan
(74) *Attorney, Agent, or Firm* — Jianq Chyun IP Office

(57) ABSTRACT

A novelty repairing method and circuit are provided by the embodiments of the present invention, wherein the input/output (IO) compression manner can be used therein to reduce the access time during the chip probing 1 (CP1) test, and each redundant column selected line (RCSL) can be divided into several partial redundant column selected lines (P-RCSLs) which are respectively responsible for repairing the defects of the corresponding regions. Based upon the repairing method, the memory circuit can reduce the number of the RCSLs. Furthermore, a variable region dividing manner is applied therein, so as to increase the probability for repairing the defect of the memory circuit.

19 Claims, 11 Drawing Sheets

REPAIRING CIRCUIT FOR MEMORY CIRCUIT AND METHOD THEREOF AND MEMORY CIRCUIT USING THE SAME

FIELD OF THE INVENTION

The invention relates to a memory circuit, and, especially to, a repairing circuit and method for a memory circuit, and the memory circuit using the same, wherein the memory circuit uses a data compression scheme to reduce the test time.

DESCRIPTION OF RELATED ART

Memory is used to store the information. For recent years, the requirement of the memory is more and more demanding. The basic function for a memory includes "read" and "write". Memory can be categorized into two groups: read only memory and random access memory, such as dynamic random access memory. Although the semiconductor process for manufacturing the memory circuit is improved, there are still faulty memory cells in the memory circuit. Thus, a test for checking whether the faulty memory cell exists is needed.

In the memory test procedure, before the memory circuit is repaired by the laser programming, a chip probing 1 (abbreviated as "CP1") test step is performed on the memory circuit. The memory circuit has a plurality of memory cells composed by the normal memory cells and the redundant memory cells. The memory cells form a memory array having a plurality of rows and columns. In the CP1 test step, a plurality of test patterns are written into all of the memory cells, and the stored values of the memory cells of each column or row are read to be checked. If the stored values of the memory cells of the column or row are equal to the corresponding test patterns, the memory cells of the column or row are judged to be passed; otherwise, the memory cells of the column or row are judged to be failed.

While the memory cells of the column or row are judged to be failed, the address information of the memory cells of the column or row is analyzed, and then the laser is illuminated such that the column or row having the faulty memory cells is replaced by the redundant column or row of the redundant memory cells. The action for replacing the column or row having the faulty memory with the redundant column or row of the redundant memory cells is called the laser repair action.

Referring to FIG. 1, FIG. 1 is a block diagram showing the conventional memory circuit. The memory circuit comprises at least one memory bank 100, and the memory bank 100 comprises a plurality of memory cells on several normal column selected lines (abbreviated as "CSLs") and redundant column selected lines (abbreviated as "RCSLs"), and a plurality of redundant column selected fuse sets (abbreviated as "RCS-FSs") 10FS0-10FS7. The cells of the redundant columns are selected by RCSLs 10R0-10R7, and the cells of the normal columns are selected by the normal CSLs. Each of the RCS-FSs 10FS0-10FS7 has an enabled fuse and one set of column addresses' identification (abbreviated as "ID") fuses. The 8 RCS-FSs 10FS0-10FS7 control the 8 RCSLs 10R0-10R7 respectively.

The redundant memory cells of the RCSLs 10R0-10R7 are respectively used to replace the memory cells of one of the normal CSLs corresponding to the input/outputs (abbreviated as "IOs") IO[0:7]E1, IO[0:7]O1, IO[8:15]E1, IO[8:15]O1, IO[0:7]E2, IO[0:7]O2, IO[8:15]E2, and IO[8:15]O2 which are located in 8 different data blocks.

For example, when one of the normal CSLs corresponding to the IOs IO[0:7]E1 has one faulty memory cell, the memory cells of the RCSL 10R0 is used to replace the memory cells of the normal CSL having the faulty memory cell. For example, when one of the normal CSLs corresponding to the IOs IO[8:15]O1 has one faulty memory cell, the memory cells of the RCSL 10R3 is used to replace the memory cells of the normal CSL having the faulty memory cell. That is, once one of the RCS-FS 10FS0-10FS7 is programmed to enabled the corresponding one of the RCSLs 10R0-10R7 to repair a defected normal CSL (i.e the normal CSL having the faulty memory cells), the whole normal CSL will be totally be replaced by the RCSL at the column address (i.e. the normal CSL is replaced by the RCSL for all row addresses at the desired column address).

To sum up, the conventional repairing method for the memory circuit costs a lot time for access the test patterns during CP1 test, and it is not efficient to replace all of the memory cells of the normal CSL having the faulty memory cell with all of the memory cells of the RCSL. Furthermore, the total number of RCS-FSs of the conventional memory circuit is the same as the number of the RCSLs (for example, 8 RCSLs 10R0-10R7 correspond to 8 RCS-FSs 10FS0-10FS7 in FIG. 1), thus wasting the area of the memory circuit layout.

SUMMARY OF THE INVENTION

The invention provides a repairing method which can support the test time reduction for CP1 test by multi-bits testing simultaneously. The memory circuit comprises a plurality of columns with memory cells and at least one repairing circuit, and the columns with memory cells comprise a plurality of normal CSLs with normal memory cells, and a first and second spare column selected lines (abbreviated as "SCSLs") with redundant memory cells, wherein the first and second SCSLs are expanded from a redundant column selected line (abbreviated as "RCSL"), and each of the SCSL is divided into several P-SCSLs in different row addresses. A first region having X rows of the memory cells, and a second region having Y rows of the memory cells are formed, wherein X and Y are positive integer larger than 0, and the RCSL is divided into a first and second partial redundant column selected lines (P-RCSLs) respectively corresponding to the first and second region and having several P-SCSLs in the different row addresses. If the Z faulty memory cells are located in the first region, the repairing circuit replaces the normal memory cells on the normal CSL corresponding to a required column address by the redundant memory cells on the first P-RCSL, wherein the required column address is a column address which has the Z faulty memory cells. If the Z faulty memory cells are located in the second region, the repairing circuit replaces the normal memory cells on the normal CSL corresponding to the required column address by the redundant memory cells on the second P-RCSL, wherein Z is a positive integer larger than 0.

According to one embodiment, the first and second regions are formed according to a selection signal.

According to one embodiment, a default value of the selection signal is set, and whether the Z faulty memory cells of the memory cells are able to be repaired is determined. If the Z faulty memory cells of the memory cells are not able to be repaired, a value of the selection signal is changed to be different from previous values of the selection signal, and the repairing method goes back to the step for forming a first and second region.

According to one embodiment, compressed test patterns are written into the memory cells, and stored values of the memory cells are read to find locations of the Z faulty memory cells of the memory cells.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
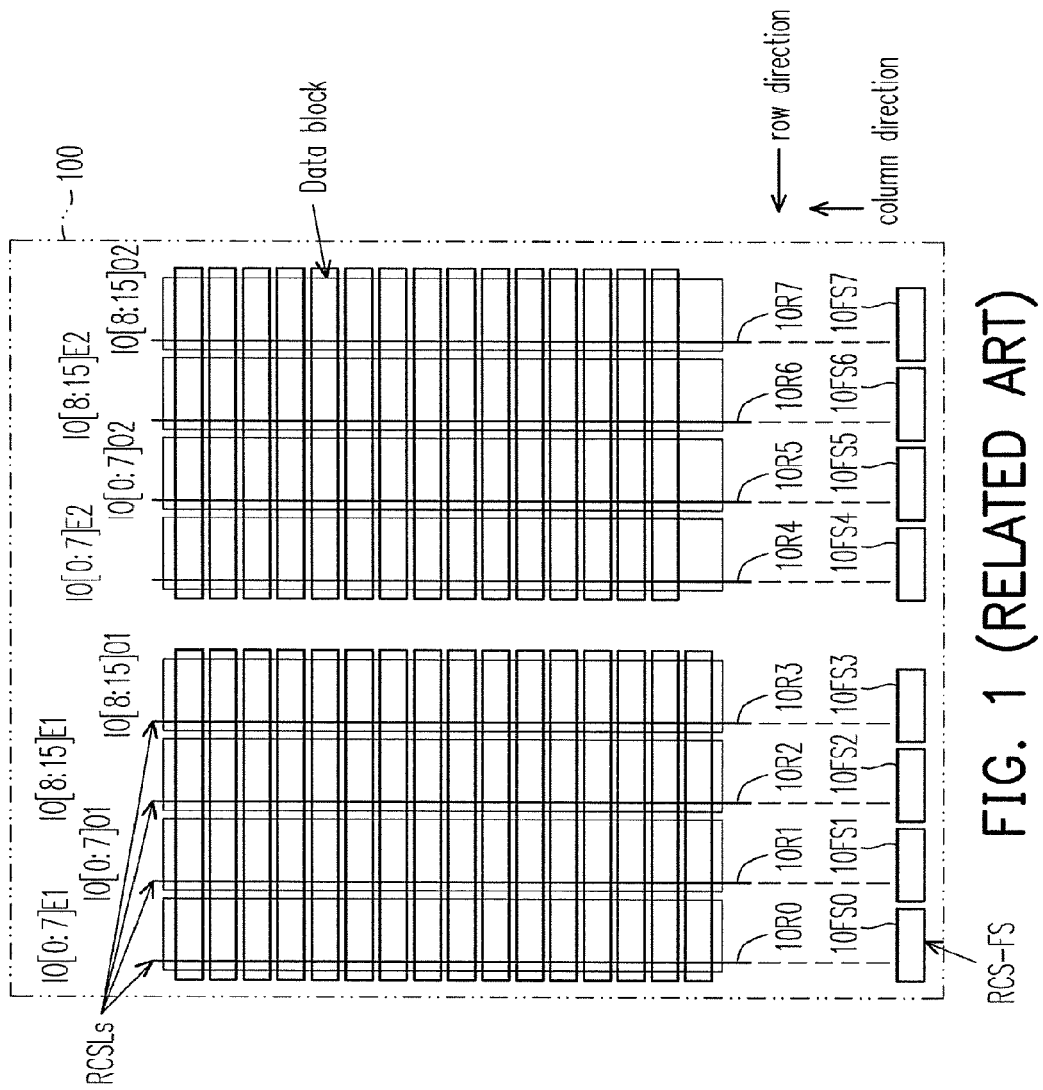
FIG. 1 is a block diagram showing the conventional memory circuit.
Figure 2:
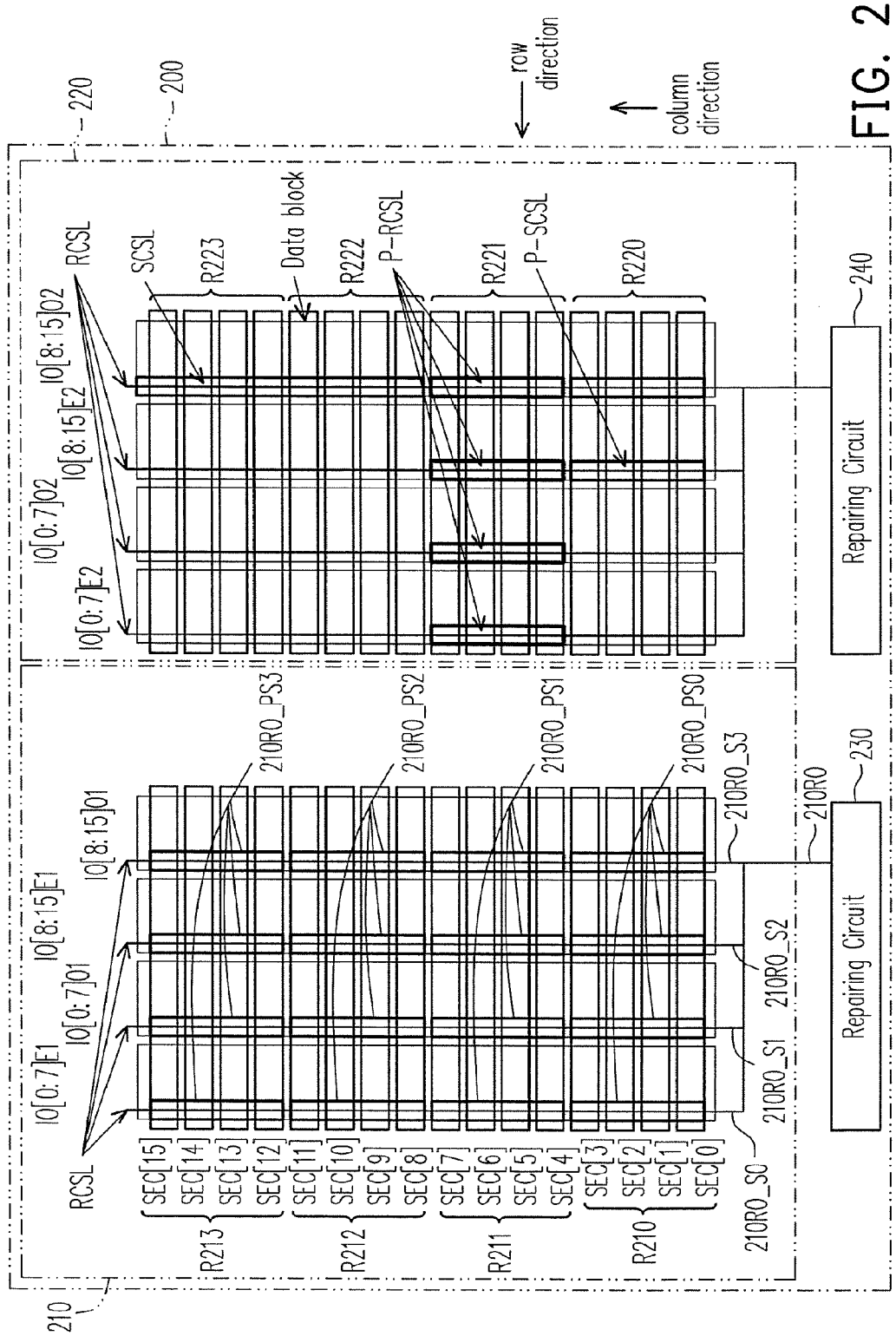
FIG. 2 is a block diagram showing a memory circuit according to one embodiment of the invention.

FIG. 2 is a block diagram showing a memory circuit according to one embodiment of the invention. The memory circuit comprises at least one of memory banks. The memory bank 200 comprises two memory arrays 210, 220, and two repairing circuits 230, 240.

In the CP1 test step, the test patterns must be accessed to the memory cells, and the time for access a large mount of different test patterns to the memory is very long. Therefore, test pattern compression, including internal IOs compression, multi-banks compression, and pre-fetch compression, is used in the CP1 test step.

Regarding the IO compression, one CSL or one RCSL of the memory circuit 200 can control 8 internal IOs at a time, and thus 8 internal IOs compression is natural for considering the column redundancy. That is, one test pattern can be accessed to all of the cells on the 8 CSLs at a time.

In FIG. 2, the 8 internal IOs IO[0:7]E1 of the memory circuit can be compressed to one single compressed IO IO[0]E1, and in the similar manner, the internal IOs IO[8:15]E1, IO[0:7]O1, IO[8:15]O1, IO[0:7]E2, IO[8:15]E2, IO[0:7]O2, IO[8:15]O2 are respectively compressed to the compressed IOs IO[8]E1, IO[0]O1, IO[8]O1, IO[0]E2, IO[8]E2, IO[0]O2, IO[8]O2.

Regarding the pre-fetch compression, the memory circuit 200 may be the double-data-rate two synchronous dynamic random access memory (abbreviated as "DDR2 SDRAM") having the 4n-bit pre-fetch structure (i.e. one external IO access can be expanded to 4 internal IOs access), and thus the 4n-bit pre-fetch is compressed to 2n-bit pre-fetch (i.e. the first and second test patterns are compressed to the first compressed test pattern, and the third and fourth test patterns are compressed to the second compressed test pattern). If the target of the column speed is not limited by the column redundancy, the 4n-bit pre-fetch can be further compressed to 1n-bit pre-fetch (i.e. the first through fourth test patterns are compressed to one compressed test pattern).

Under the case that the 4n-bit pre-fetch is compressed to 2n-bit pre-fetch, in the embodiment of FIG. 2, the test patterns of the compressed IOs IO[0]E1 IO[8]E1, IO[0]O1, IO[8]O1 are compressed to the first test pattern of the compressed IO IO[0]E, and the test patterns of the compressed IOs IO[0]E2 IO[8]E2, IO[0]O2, IO[8]O2 are compressed to the second test pattern of the compressed IO IO[0]O. Under the case that the 4n-bit pre-fetch is compressed to 1n-bit pre-fetch, in the embodiment of FIG. 2, the test patterns of the compressed IOs IO[0]E1 IO[8]E1, IO[0]O1, IO[8]O1, IO[0]E2 IO[8]E2, IO[0]O2, IO[8]O2 are compressed to one test pattern of the compressed IO IO[0].

Regarding the multi-banks compression, different memory banks output to different external IOs respectively, such that the different memory banks may output the stored test patterns simultaneously.

For example, the memory circuit may have 4 memory banks, and thus the first compressed test patterns of the compressed IOs IO[0]E and IO[0]O can be accessed by one memory bank through a external IOs XIO[0]. By the similar deduction, the external IOs XIO[1]-XIO[3] are respectively for the other three memory banks.

Accordingly, 8(internal IOs controlled by one CSL)*4(or 8 data blocks or CSLs)*4(memory banks)=128 (or 256) bits can be accessed and tested through 4 external IOs XIO[0]-XIO[3] which stand for 4 different banks respectively in a die of the memory circuit simultaneously. The test patterns are compressed according to the above compression manner. The compressed patterns can be accessed to the memory cells of the memory bank, and check whether there is any faulty memory cell (i.e. defected memory cell) existing therein.

Both of the memory arrays 210 and 220 have a plurality of memory cells arranged, the memory cells can divided into several columns and rows. The memory cells of each of the memory arrays 210 and 220 comprise a plurality of normal memory cells and redundant memory cells. In the embodiment, the repairing circuit 230 is responsible for the control circuits to repair the defects of the memory array 210, and the repairing circuit 240 is responsible for the control circuits to repair the defects of the memory array 220.

Regarding the memory array 210, the redundant memory cells of all of redundant columns are selected by one RCSL 210R0. The RCSL 210R0 is expanded to four SCSLs 210R0_S0-210R0_S3 located in different data blocks, and each of the SCSLs 210R0_S0-210R0_S3 is divided into several P-SCSLs located in different rows corresponding to different row addresses. The RCSL 210R0 can be also divided into several P-RCSLs 210R0_PS0-210R0_PS3 located in different row addresses of the regions R210-R213. Each of the P-RCSLs 210R0_PS0-210R0_PS3 has several P-SCSLs and the P-SCSLs are located in different data blocks.

The rows of the memory cells of the memory array 210 are divided into four regions R210-R213, wherein the region R210 comprises the sections SEC[0]-SEC[3] of the memory cells, the region R211 comprises the sections SEC[4]-SEC[7] of the memory cells, the region R212 comprises the sections SEC[8]-SEC[11] of the memory cells, and the region R212 comprises the sections SEC[12]-SEC[15] of the memory cells. While the region R210 has at least one faulty memory cell on the same column address of the normal column, the repairing circuit 230 selects the memory cells of the P-RCSL 210R0_PS0 to replace the memory cells on the same column address of the normal column in region R210. The column address controls four normal CSLs which are located in 4 different data blocks at a time. That is, the column address can control the 4 normal CSLs corresponding to the IOs IO[0:7] E1, IO[0:7]O1, IO[8:15]E1, and IO[8:15]O1 at a time.

If the faulty memory cells are located on the section SEC [2], and the faulty memory cells are located on the normal CSLs corresponding to IOs IO[0:7]O1, IO[8:15]E1, the repairing circuit 230 selects the memory cells on the P-SCSLs of the P-RCSL 210R0_PS0 to replace the memory cells on the normal CSLs corresponding to the IOs IO[0:7]E1, IO[0:7]O1, IO[8:15]E1, and IO[8:15]O1 in the region R210.

If the faulty memory cells are located on the section SEC [0], and the faulty memory cells are located on the normal CSL corresponding to IO IO[0:7]E1, IO[0:7]O1, IO[8:15]E1, IO[8:15]O1, the repairing circuit 230 selects the memory cells on the P-SCSLs of the P-RCSL 210R0_PS0 to replace the memory cells on the normal CSLs corresponding to the IOs IO[0:7]E1, IO[0:7]O1, IO[8:15]E1, and IO[8:15]O1 in the region R210.

According to the similar manner, how to repair the faulty memory cell in the regions R211, R212, or R213 can be deduced, and therefore the copious description related will not be stated again. Furthermore, the operations and structures related to the memory array 220 and the repairing circuit 240 can be deduced according to the description related to the memory array 210 and the repairing circuit 230, and therefore the copious description related will not be stated again.

The defect herein is defined as the condition that the faulty memory cells in the same row region are corresponding to the same column address. Therefore, in the embodiment of FIG. 2, each of the repairing circuits 230 and 240 can repair 4 defects in the different regions R210-R213 or R220-R223.

Figure 3A:
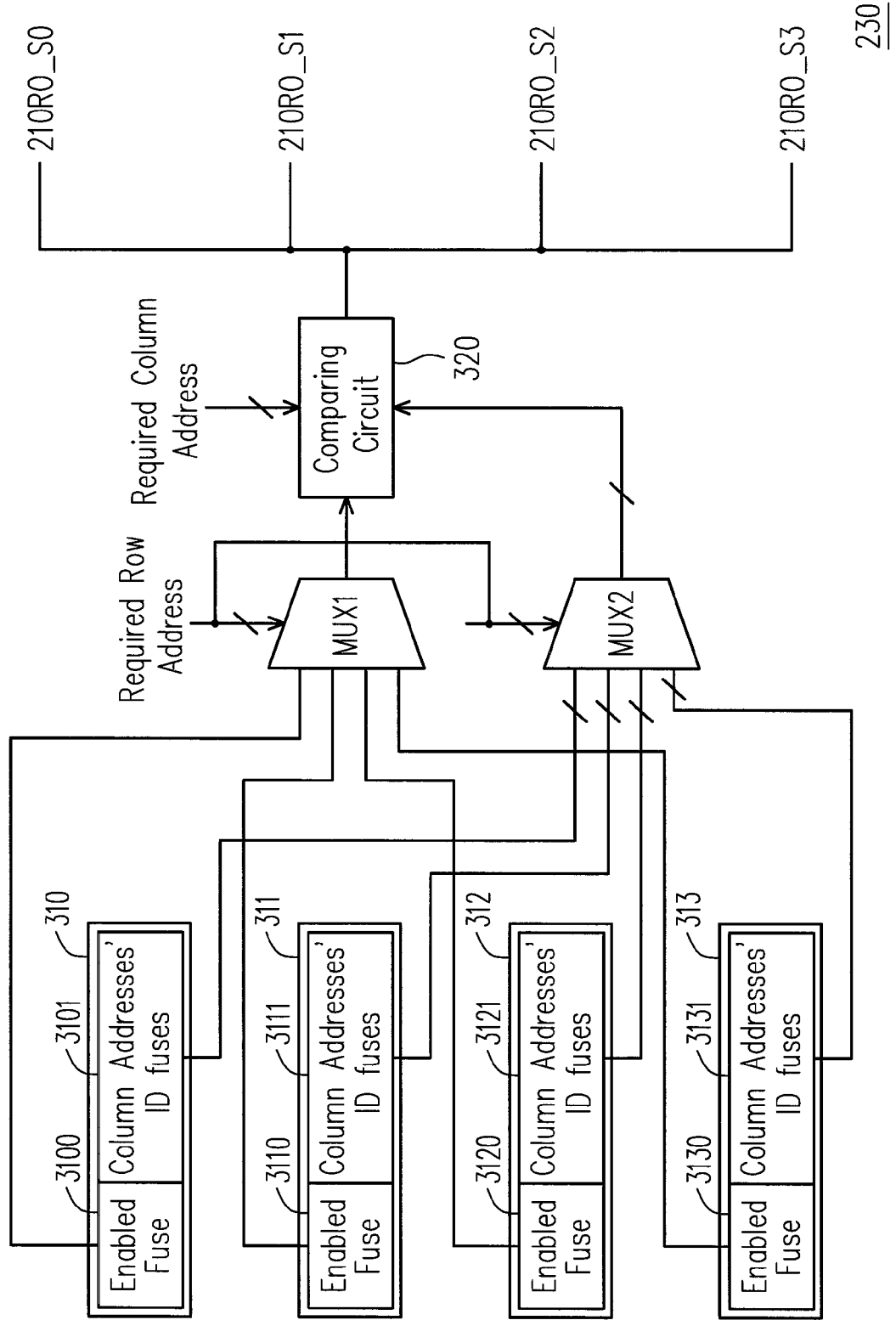
FIG. 3A is a block diagram showing a repairing circuit according to one embodiment of the invention.

FIG. 3A is a block diagram showing a repairing circuit according to one embodiment of the invention. The repairing circuit 230 comprises four P-RCS-FSs 310-313, two multiplexers MUX1-MUX2, and a comparing circuit 320.

Each of the P-RCS-FSs 310-313 has one enabled fuse 3100-3130 and one set of column addresses' ID fuses 3101-3131, respectively and each of the P-RCS-FSs 310-313 has its own ID which is used to identify which region it stands for. For example, the P-RCS-FS 310 is responsible for the region R210.

The multiplexer MUX1 receives the enabled signals output from the enabled fuses 3100, 3110, 3120, and 3130. The multiplexer MUX1 outputs one of the enabled signals according to the required row address which can decode one of the different row regions R210, R211, 8212, and R123. For example, if the section SEC[0] has the faulty memory cell and row region R210 is selected, the required row address indicates the multiplexer MUX1 to output the enabled signal from the enabled fuse 3100. The enabled signal output from the multiplexer MUX1 is then input to the comparing circuit 320.

The multiplexer MUX2 receives the column address signals output from column addresses' ID fuses 3101, 3111, 3121, and 3131. The multiplexer MUX2 outputs one of the column address signals according to the required row address. For example, if the section SEC[0] has the faulty memory cell and row region R210 is selected, the required row address indicates the multiplexer MUX2 outputs the column address signals from the column addresses' ID fuses 3101. The column address signals output from the multiplexer MUX2 are then input to the comparing circuit 320.

The comparing circuit 320 receives the column address signals output from the multiplexer MUX2, the enabled signal output from the multiplexer MUX1, and the required column address which can decode all of the column address in the memory array 210, and activates the P-RCSL of the SCSLs 210R0_S0-210R0_S3 in the corresponding row region according to the column address signals output from the multiplexer MUX2, enabled signal output from the multiplexer MUX1, and the required column address.

For example, if the region R210 has the faulty memory cell on the normal CSL corresponding to the IO IO[0:7]E1 and the row region R210 is selected, the comparing circuit 320 receives the enabled signal output from the enabled fuse 3100, the column address signals output from the column addresses' ID fuses 3101, and the required column address, so as to activates the P-RCSL 210R0_PS0 of the SCSLs 210R0_S0-210R0_S3 in region R210 (i.e. the SCSLs 210R0_S0-210R0_S3 in the sections SEC[0]-SEC[3] are activated). Therefore, the memory cells of the CSLs corresponding to the required column address in region R210 are replaced by the memory cells of the P-RCSL 210R0_PS0 of the SCSLs 210R0_S0-210R0_S3.

Figure 3B:
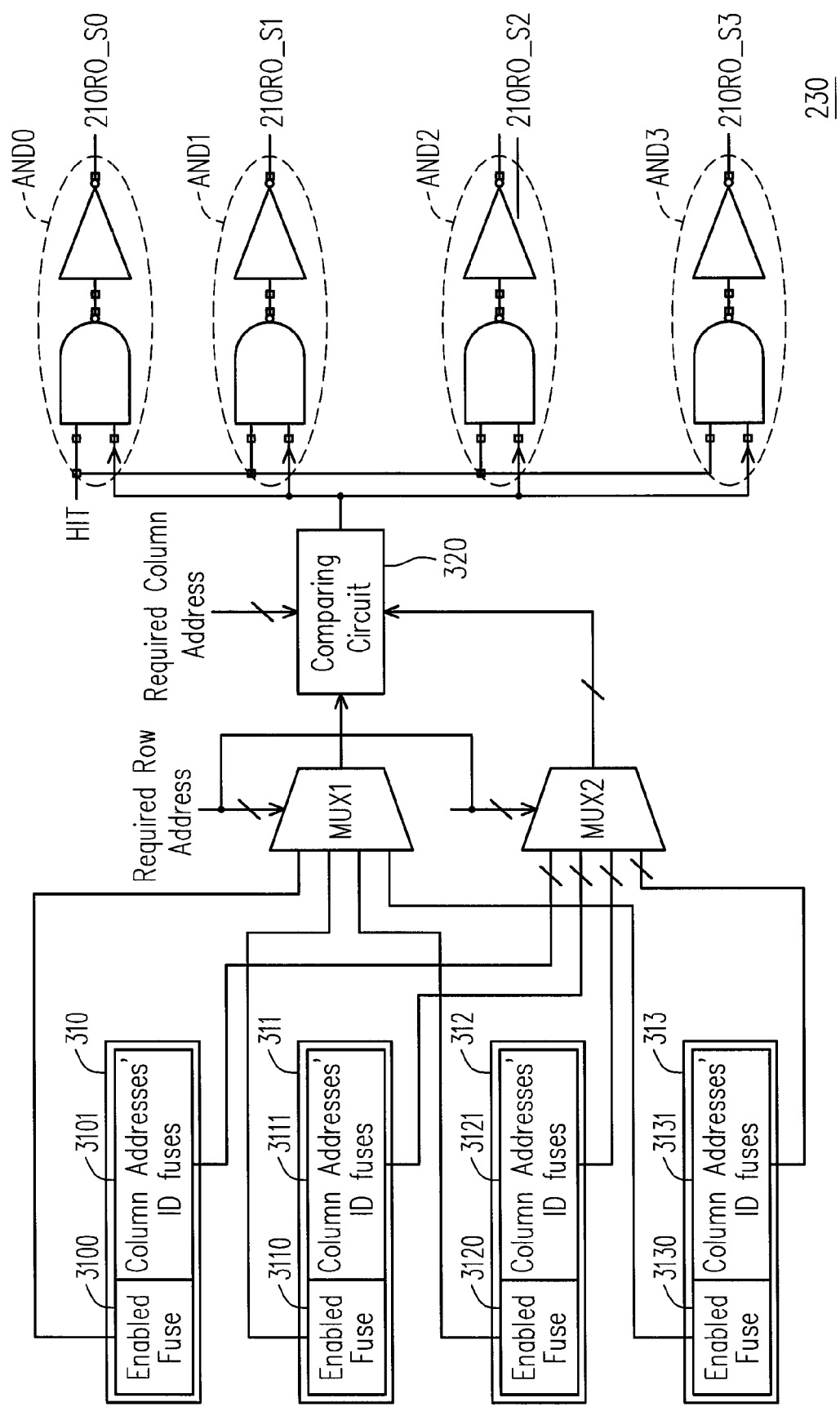
FIG. 3B is a block diagram showing a repairing circuit according to another one embodiment of the invention.

FIG. 3B is a block diagram showing a repairing circuit according to another one embodiment of the invention. The repairing circuit 230 in FIG. 3B is similar to that in FIG. 3A, but the repairing circuit 230 in FIG. 3B further comprises a plurality of AND gates AND0-AND3, wherein the AND gates AND0-AND3 activates the P-RCSL of the SCSLs 210R0_S0-210R0_S3 in the corresponding region while a hit signal HIT is high, and the hit signal HIT represents that the timing of turning on column selected line is coming.

Figure 4:
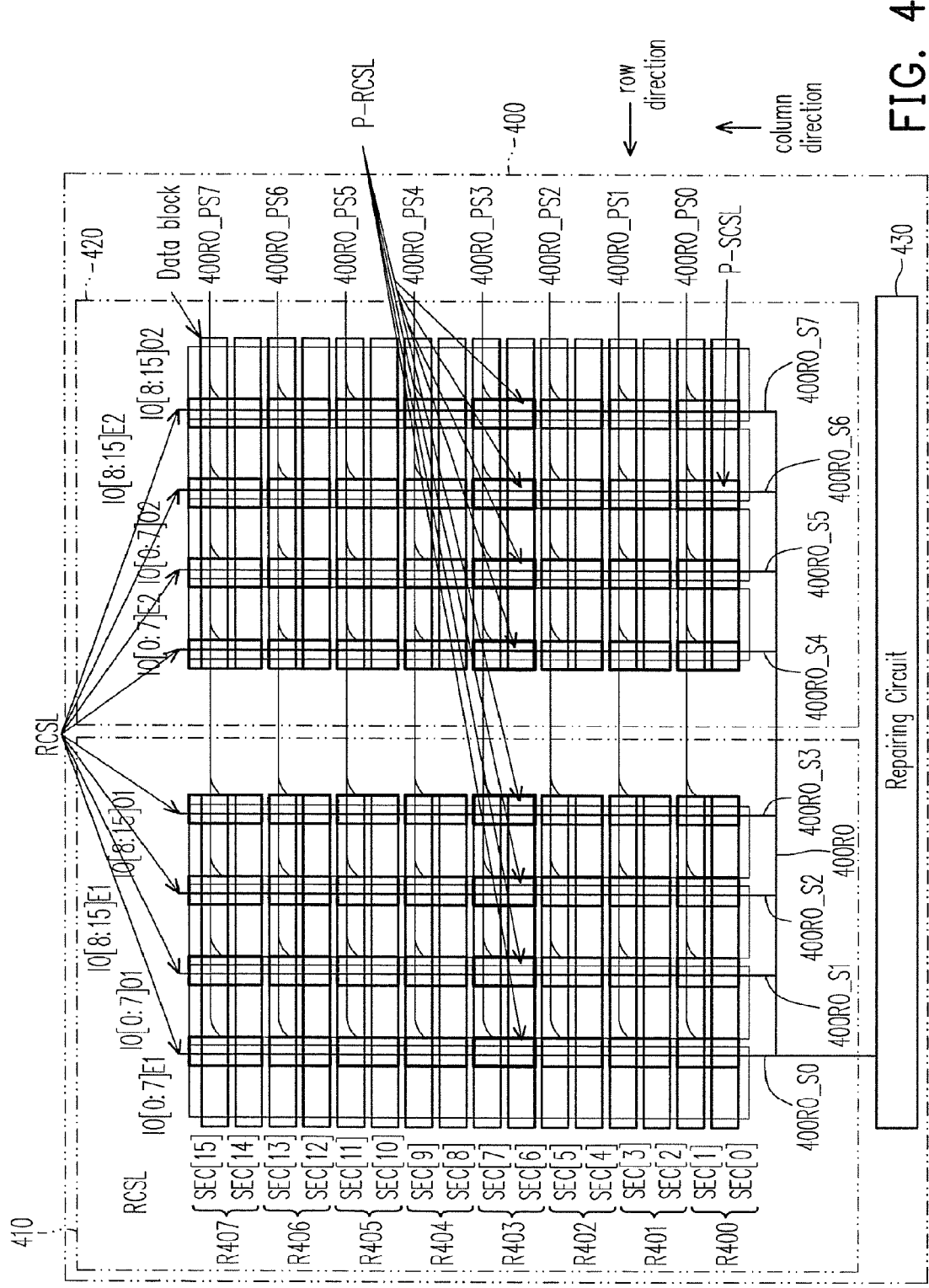
FIG. 4 is a block diagram showing a memory circuit according to another one embodiment of the invention.

Referring to FIG. 4, FIG. 4 is a block diagram showing a memory circuit according to another one embodiment of the invention. The memory circuit comprises at least one of memory banks, and in FIG. 4, merely a memory bank 400 is shown. The memory bank 400 comprises two memory arrays 410, 420, and one repairing circuits 430. In the embodiment, the repairing circuit 430 is responsible for the control circuits to repair the defects of the memory arrays 410 and 420.

The redundant memory cells of all of redundant columns are selected by one RCSL 400R0. The RCSL 400R0 is expanded to 8 SCSLs 400R0_S0-400R0_S7 located in 8 different data blocks, and each of the SCSLs 400R0_S0-400R0_S7 is divided into several P-SCSLs located in different rows corresponding to different row addresses. The RCSL 400R0 can be also divided into several P-RCSLs 400R0_PS0-400R0_PS7 located in different row addresses of the regions R400-R407. Each of the P-RCSLs 400R0_PS0-400R0_PS7 has several P-SCSLs in the same row region, and the P-SCSLs are located in different data blocks.

The rows of the memory cells of the memory arrays 410 and 420 are divided into 8 regions R400-R407, wherein the regions R400-R407 comprise the sections of SEC[0]-SEC[1], SEC[2]-SEC[3], SEC[4]-SEC[5], SEC[6]-SEC[7], SEC[8]-SEC[9], SEC[10]-SEC[11], SEC[12]-SEC[13], and SEC[14]-SEC[15] of the memory cells, respectively.

While the region R400 has at least one faulty memory cell on the same column address of the normal CSL, the repairing circuit 430 selects the memory cells of the P-RCSL 400R0_PS0 to replace the memory cells on the same column address of the normal CSL in region R400. The column address controls 8 normal CSLs which are located in 8 different data blocks at a time. That is, the column address can control the 8 normal CSLs corresponding to the IOs IO[0:7] E1, IO[0:7]O1, IO[8:15]E1, IO[8:15]O1, IO[0:7]E2, IO[0:7] O2, IO[8:15]E2, and IO[8:15]O2 at a time. If the faulty memory cells are located on the section SEC[2], and the faulty memory cells are located on the normal CSLs corresponding to IOs IO[0:7]O1, IO[8:15]E2, the repairing circuit 430 selects the memory cells on the P-SCSLs of the P-RCSL 400R0_PS1 to replace the memory cells on the normal CSLs corresponding to the IOs IO[0:7]E1, IO[0:7]O1, IO[8:15]E1, IO[8:15]O1, IO[0:7]E2, IO[0:7]O2, IO[8:15]E2, and IO[8:15]O2 in the region R401. If the faulty memory cells are located on the section SEC[0], and the faulty memory cells are located on the normal CSL corresponding to IO IO[0:7]E1, IO[0:7]O1, IO[8:15]E1, IO[8:15]O1, the repairing circuit 430 selects the memory cells on the P-SCSLs of the P-RCSL 400R0_PS0 to replace the memory cells on the normal CSLs corresponding to the IOs IO[0:7]E1, IO[0:7]O1, IO[8:15]E1, IO[8:15]O1, IO[0:7]E2, IO[0:7]O2, IO[8:15]E2, and IO[8:15]O2 in the region R400.

According to the similar manner, how to repair the faulty memory cell in the regions R402-R407 can be deduced, and therefore the copious description related will not be stated again. The defect herein is defined as the condition that the faulty memory cells in the same row region are corresponding to the same column address. Therefore, in the embodiment of FIG. 4, the repairing circuit 430 can repair 8 defects in the different regions R400-R407.

Figure 5:
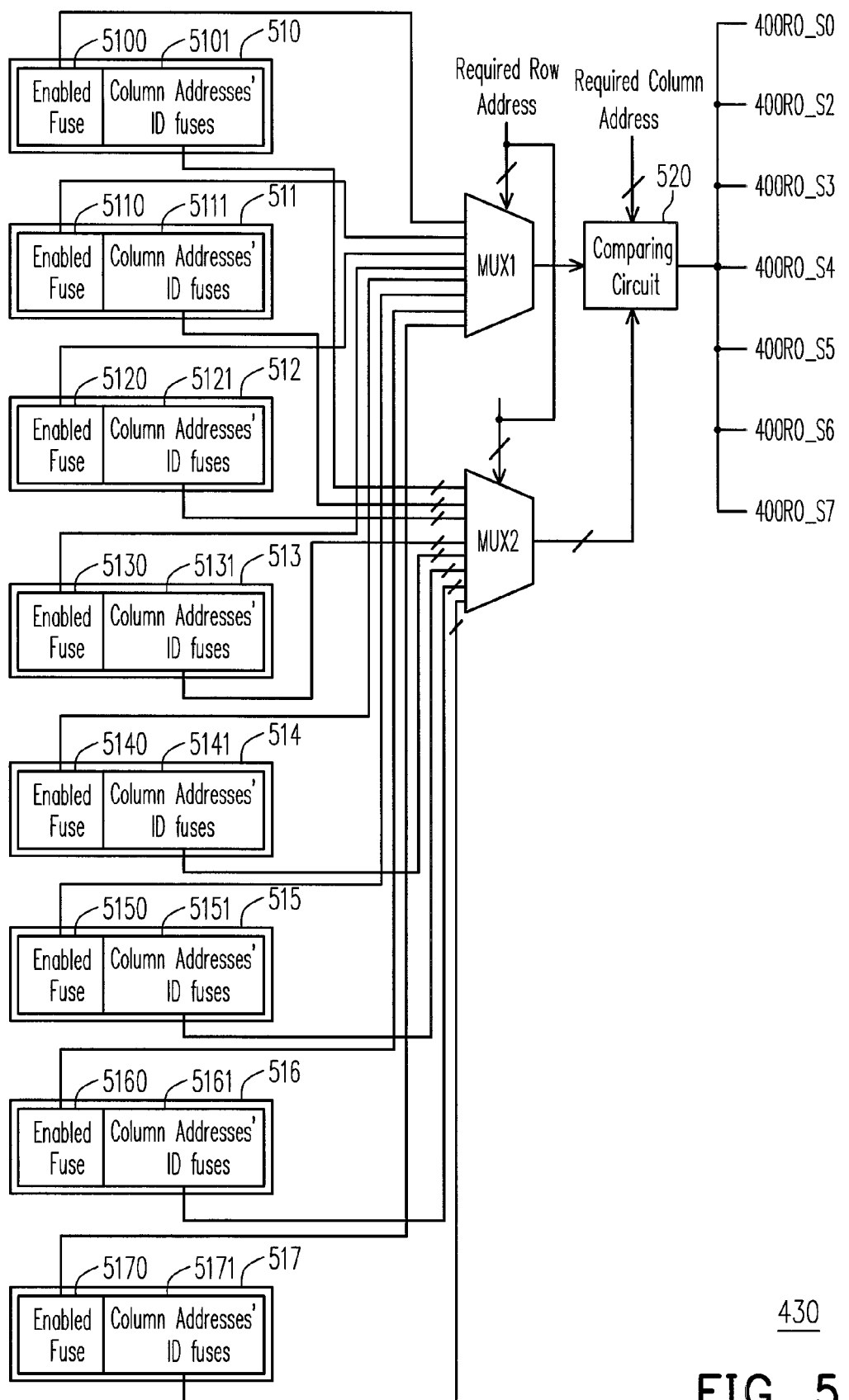
FIG. 5 is a block diagram showing a repairing circuit according to another one embodiment of the invention.

FIG. 5 is a block diagram showing a repairing circuit according to another one embodiment of the invention. The repairing circuit 430 comprises 8 P-RCS-FSs 510-517, two multiplexers MUX1-MUX2, and a comparing circuit 520.

Each of P-RCS-FS 510-517 has an enabled fuse 5100-5170 and one set of column addresses' ID fuses 5101-5107, respectively, and each of the P-RCS-FSs 510-517 has its own ID which is used to identify which region it stands for. For example, the P-RCS-FS 510 is responsible for the region R400.

The multiplexer MUX1 receives the enabled signals output from the enabled fuses 5100, 5110, 5120, 5130, 5140, 5150, 5160, and 5170. The multiplexer MUX1 outputs one of the enabled signals according to the required row address which can decode one of the different row regions, R400, R401, R402, R403, R404, R405, R406, and R407. For example, if the section SEC[0] has the faulty memory cell and the row region R400 is selected, the required row address indicates the multiplexer MUX1 to output the enabled signal from the enabled fuse 5100. The enabled signal output from the multiplexer MUX1 is then input to the comparing circuit 520.

The multiplexer MUX2 receives the column address signals output from column addresses' ID fuses 5101, 5111, 5121, 5131, 5141, 5151, 5161, and 5171. The multiplexer MUX2 outputs one of the column address signals according to the required row address. For example, if the section SEC[0] has the faulty memory cell and the row region R400 is selected, the required row address indicates the multiplexer MUX2 outputs the column address signals from the column addresses' ID fuses 5101. The column address signals output from the multiplexer MUX2 are then input to the comparing circuit 520.

The comparing circuit 520 receives the column address signals output from the multiplexer MUX2, the enabled signal output from the multiplexer MUX1, and the required column address which can decode all of the column address in the two memory array 410 and 420, and activates the P-RCSL of the SCSLs 400R0_S0-400R0_S7 in the corresponding row region according to the column address signals output from the multiplexer MUX2, enabled signal output from the multiplexer MUX1, and the required column address.

For example, the region R400 has the faulty memory cell on the normal CSL corresponding to the IO IO[0:7]E1, and thus the comparing circuit 520 receives the enabled signal output from the enabled fuse 5100, the column address signals output from the column addresses' ID fuses 5101, and the required column address, so as to activates the P-RCSL 400R0_PS0 of the SCSLs 400R0_S0-400R0_S7 in region R400 (i.e. the SCSLs 400R0_S0-400R0_S7 in the sections SEC[0]-SEC[1] are activated). Therefore, the memory cells of the CSLs corresponding to the required column address in region R400 are replaced by the memory cells of the P-RCSL 400R0_PS0 of the SCSLs 400R0_S0-400R0_S7.

Figure 6:
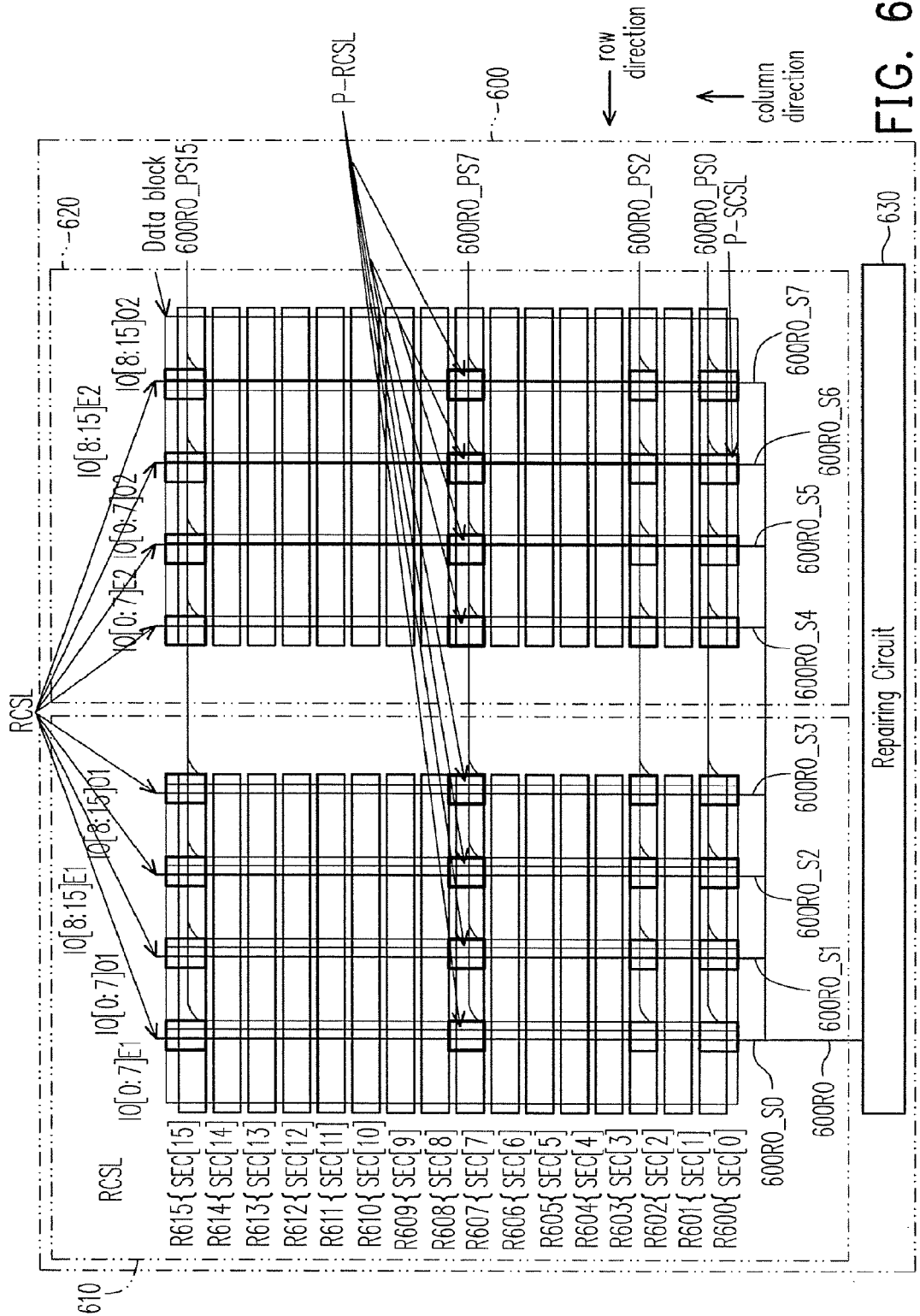
FIG. 6 is a block diagram showing a memory circuit according to another one embodiment of the invention.

Referring to FIG. 6, FIG. 6 is a block diagram showing a memory circuit according to another one embodiment of the invention. The memory circuit comprises at least one of memory banks, and in FIG. 6, merely a memory bank 600 is shown. The memory bank 600 comprises two memory arrays 610, 620, and one repairing circuits 630. In the embodiment, the repairing circuit 630 is responsible for the control circuits to repair the defects of the memory arrays 610 and 620.

The redundant memory cells of all of redundant CSLs are selected by one RCSL 600R0. The RCSL 600R0 is expanded to 8 SCSLs 600R0_S0-600R0_S7 located in different data blocks, and each of the SCSLs 600R0_S0-600R0_S7 is divided into several P-SCSLs located in different row addresses.

The rows of the memory cells of the memory arrays 610 and 620 are divided into 16 regions R600-R615, wherein each of the regions R600-R615 respectively comprises one of the sections SEC[0]-SEC[15] of the memory cells. Each of the P-RCSLs 600R0_PS0-600R0_PS15 has several P-SCSLs in the same row region, and the P-SCSLs are located in different data blocks.

In FIG. 6, while the region R600 has at least one faulty memory cell on the same column address of the normal CSL, the repairing circuit 630 selects the memory cells of the P-RCSL 600R0_PS0 to replace the memory cells on the same column address of the normal CSL in the region R600.

In the embodiment of FIG. 6, the column address controls 8 normal CSLs which are located in 8 different data blocks at a time. That is, the column address can control the 8 normal CSLs corresponding to the IOs IO[0:7]E1, IO[0:7]O1, IO[8:15]E1, IO[8:15]O1, IO[0:7]E2, IO[0:7]O2, IO[8:15]E2, and IO[8:15]O2 at a time.

If the faulty memory cells are located on the section SEC[2], and the faulty memory cells are located on the normal CSLs corresponding to IOs IO[0:7]O1, IO[8:15]E2, the repairing circuit 630 selects the memory cells on the P-SCSLs of the P-RCSL 600R0_PS2 to replace the memory cells on the normal CSLs corresponding to the IOs IO[0:7]E1, IO[0:7]O1, IO[8:15]E1, IO[8:15]O1, IO[0:7]E2, IO[0:7]O2, IO[8:15]E2, and IO[8:15]O2 in the region R602.

If the faulty memory cells are located on the section SEC[0], and the faulty memory cells are located on the normal CSL corresponding to IO IO[0:7]E1, IO[0:7]O1, IO[8:15]E1, IO[8:15]O1, the repairing circuit 630 selects the memory cells on the P-SCSLs of the P-RCSL 600R0_PS0 to replace the memory cells on the normal CSLs corresponding to the IOs IO[0:7]E1, IO[0:7]O1, IO[8:15]E1, IO[8:15]O1, IO[0:7]E2, IO[0:7]O2, IO[8:15]E2, and IO[8:15]O2 in the region R600.

According to the similar manner, how to repair the faulty memory cell in the regions R601, R603-R615 can be deduced, and therefore the copious description related will not be stated again. The defect herein is defined as the condition that the faulty memory cells in the same row region are corresponding to the same column address. Therefore, in the embodiment of FIG. 6, the repairing circuit 630 can repair 16 defects in the different regions R600-R615.

Figure 7:
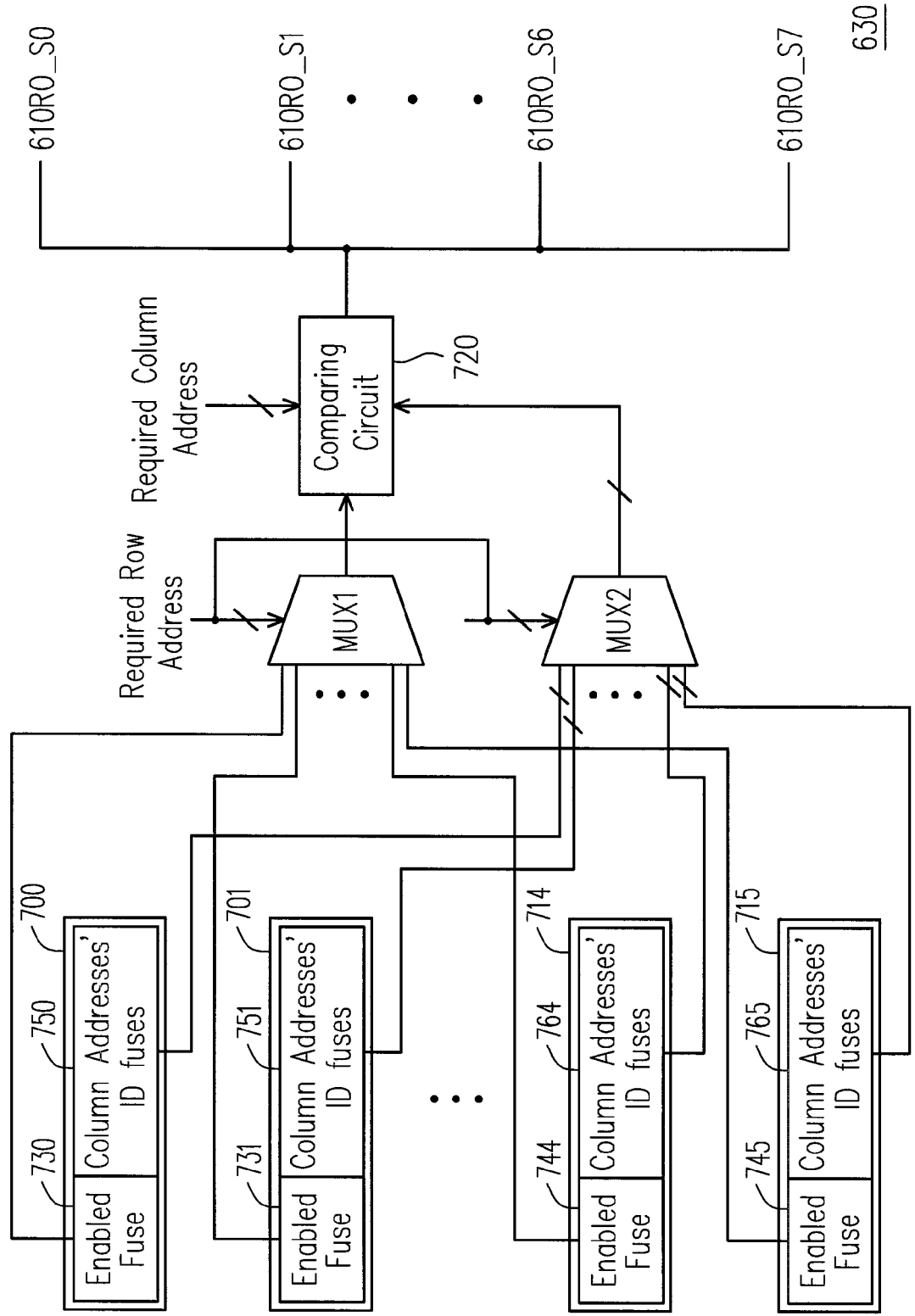
FIG. 7 is a block diagram showing a repairing circuit according to another one embodiment of the invention.

FIG. 7 is a block diagram showing a repairing circuit according to another one embodiment of the invention. The repairing circuit 630 comprises 16 P-RCS-FSs 700-715, two multiplexers MUX1-MUX2, and a comparing circuit 720.

Each of the P-RCS-FSs 700-715 respectively has one of enabled fuses 730-745 and one set of the column addresses' ID fuses 750-765. Each of the P-RCS-FSs 700-715 has own ID which is used to identify which region it stands for. For example, the P-RCS-FS 700 is responsible for the row region R600.

The multiplexer MUX1 receives the enabled signals output from the enabled fuses 700-715. The multiplexer MUX1 outputs one of the enabled signals according to the required row address which can decode one of the different row regions R600-R615. For example, if the section SEC[0] has the faulty memory cell and the row region R600 is selected, the required row address indicates the multiplexer MUX1 to output the enabled signal from the enabled fuse 700. The enabled signal output from the multiplexer MUX1 is then input to the comparing circuit 720.

The multiplexer MUX2 receives the column address signals output from column addresses' ID fuses 750-765. The multiplexer MUX2 outputs one of the column address signals according to the required row address which represents the row address of the at least one faulty memory cell. For example, if the section SEC[0] has the faulty memory cell and the row region R600 is selected, the required row address indicates the multiplexer MUX2 outputs the column address signals from the column addresses' ID fuses 750. The column address signals output from the multiplexer MUX2 are then input to the comparing circuit 720.

The comparing circuit 720 receives the column address signals output from the multiplexer MUX2, the enabled signal output from the multiplexer MUX1, and the required column address which can decode all of the column address in the memory array 610 & 620, and activates the P-RCSL of the SCSLs 600R0_S0-600R0_S7 in the corresponding region according to the column address signals output from the multiplexer MUX2, enabled signal output from the multiplexer MUX1, and the required column address.

For example, the row region R600 has the faulty memory cell on the normal CSL corresponding to the IO IO[0:7]E1. If the row region R600 is selected, the comparing circuit 720 receives the enabled signal output from the enabled fuse 730, the column address signals output from the column addresses' ID fuses 750, and the required column address, so as to activates the P-RCSL 600R0_PS0 of the SCSLs 600R0_S0-600R0_S7 in region R600 (i.e. the SCSLs 600R0_S0-600R0_S7 in the sections SEC[0] are activated). Therefore, the memory cells of the CSLs corresponding to the required column address in region R600 are replaced by the memory cells of the P-RCSL 600R0_PS0 of the SCSLs 600R0_S0-600R0_S7.

Figure 8:
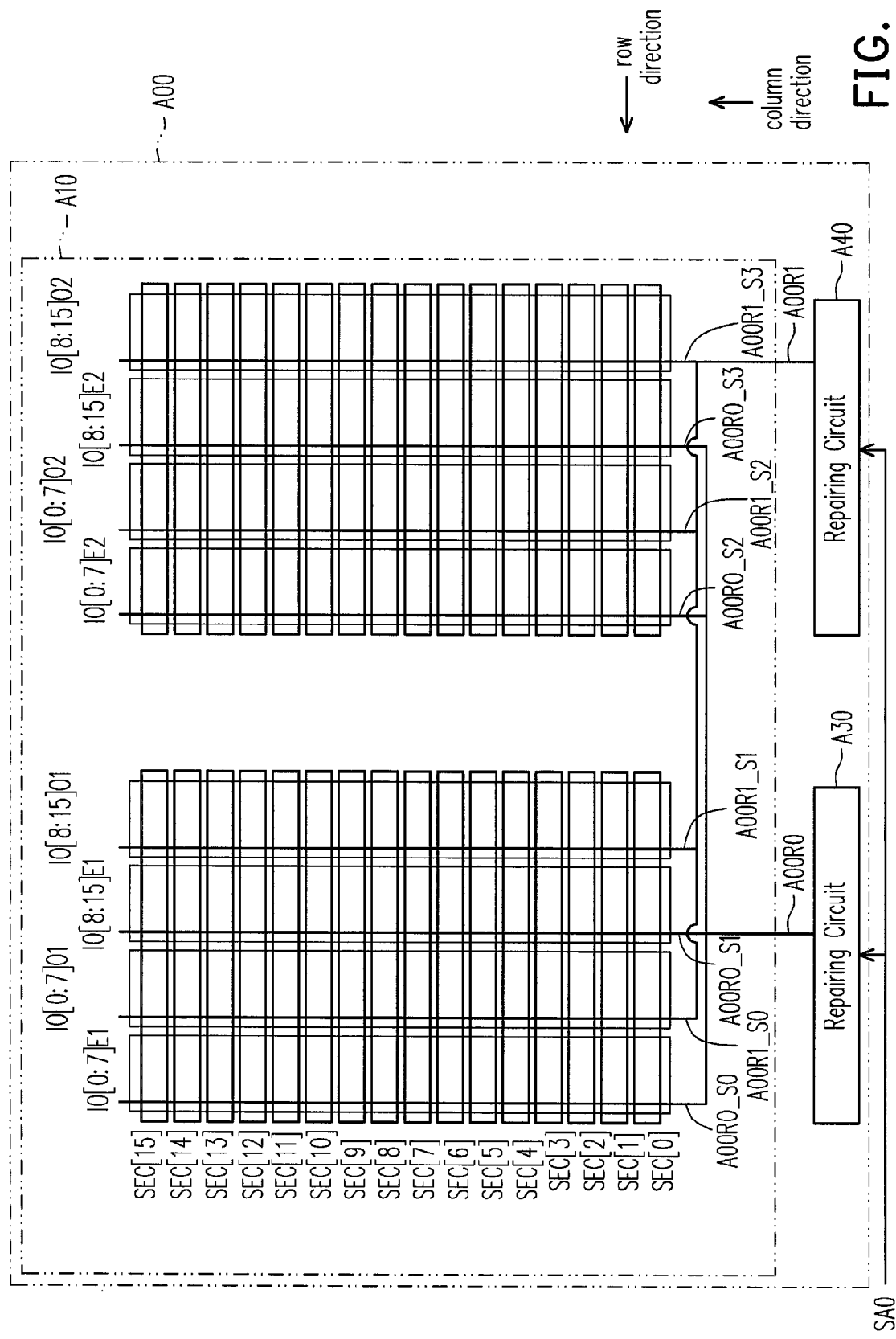
FIG. 8 is a block diagram showing a memory circuit according to another one embodiment of the invention.

FIG. 8 is a block diagram showing a memory circuit according to another one embodiment of the invention. The memory circuit comprises at least one of memory banks, and in FIG. 8, merely a memory bank A00 is shown. The memory bank A00 comprises one memory array A10 and two repairing circuits A30, A40. In the embodiment, the repairing circuits A30 and A40 are responsible for the control circuits to repair the defects of the memory array A10.

To put it more concretely, each of the repairing circuits A30 and A40 is responsible for controlling the repairing part of faulty memory cells of the memory array A10. For example, the repairing circuit A30 is responsible for controlling the repairing faulty memory cells corresponding to the IOs IO[0:7]E1, IO[8:15]E1, IO[0:7]E2, and IO[8:15]E2, and the repairing circuit A40 is responsible for controlling the repairing faulty memory cells corresponding to the IOs IO[0:7]O1, IO[8:15]O1, IO[0:7]O2, and 10[8:15]O2.

Part of the redundant memory cells of all of redundant CSLs are selected by one of the RCSLs A00R0-A00R1. The RCSLs A00R0-A00R1 are respectively expanded to 4 SCSLs A00R0_S0-A00R0_S3 and A00R1_S0-A00R1_S3 located in different data blocks, and each of the SCSLs A00R0_S0-A00R0_S3 and A00R1_S0-A00R1_S3 is divided into several P-SCSLs located in different rows corresponding to different row addresses.

The rows of the memory cells of the memory array A00 are divided into 4 regions RA00-RA03, wherein each of the regions RA00-RA03 respectively comprises alternative four sections among the sections SEC[0]-SEC[15] of the memory cells. Each of the P-RCSLs A00R0_PS0-A00R0_PS03 and A00R1_PS0-A00R1_PS03 has several P-SCSLs in the same row region, and the P-SCSLs are located in different data blocks.

A selection signal SA0 is input to the repairing circuits A30 and A40, wherein the selection signal SA0 determines which four sections of the sections SEC[0]-SEC[15] are included in the 4 regions RA00-RA03. For example, the selection signal SA0 determines that each of the regions RA00-RA03 have the four sections which row addresses have the same two most significant bits, or have the same two less significant bits. However, the invention is not limited thereto, in the other embodiment, the selection signal SA0 determines that each of the regions RA00-RA03 have the four random sections (i.e. every four random sections are included in each of the regions RA00-RA03).

While the repairing circuits A30 and A40 can not repair all defects in the memory bank A00, the value of the selection signal SA0 is changed. Thus the every four current sections of the 4 regions RA00-RA03 are not the same as the every four previous sections of regions RA00-RA03, and the probability for repairing all defects is increased. Furthermore, the default value of the selection signal SA0 determines that the regions RA00-RA03 respectively have the every four sections SEC[0]-SEC[3], SEC[4]-SEC[7], SEC[8]-SEC[11], SEC[12]-SEC[15]. It is noted that, the default value of the selection signal SA0 is not used to limit the invention.

In FIG. 8, regarding the IOs IO[0:7]E1, IO[8:15]E1, IO[0:7]E2, and IO[8:15]E2, while the region RA00 has at least one faulty memory cell on the same column address of the normal column, the repairing circuit A30 selects the memory cells of the P-RCSL A00R0_PS0 to replace the memory cells on the same column address of the normal column in the region RA00. Regarding the IOs IO[0:7]O1, IO[8:15]O1, IO[0:7]O2, and IO[8:15]O2, while the region RA00 has at least one faulty memory cell on the same column address of the normal column, the repairing circuit A40 selects the memory cells of the P-RCSL A00R1_PS0 to replace the memory cells on the same column address of the normal column in the region RA00.

In the embodiment of FIG. 8, one column address can control 4 normal CSLs which are located in 4 different data blocks at a time. That is, the column address can control the 4 normal CSLs corresponding to the IOs IO[0:7]E1, IO[8:15]E1, IO[0:7]E2, and IO[8:15]E2, or the IOs IOs IO[0:7]O1, IO[8:15]O1, IO[0:7]O2, and IO[8:15]O2.

If the faulty memory cells are located on the normal CSLs corresponding to the IO IO[0:7]E1 of the sections SEC[0]-SEC[1], SEC[4]-SEC[5], and corresponding to the IO IO[0:7]E1 of the sections SEC[2]-SEC[3], SEC[6]-SEC[7], the repairing circuit A30 can not repair the defects in the region either RA00 or RA01 individually while the default value of the selection signal SA0 determines that the regions RA00-RA03 respectively have the every four sections SEC[0]-SEC[3], SEC[4]-SEC[7], SEC[8]-SEC[11], SEC[12]-SEC[15].

Therefore, the value of the selection signal SA0 is changed to determine that that the regions RA00-RA03 respectively have the every four sections SEC[0]-SEC[1] and SEC[4]-SEC[5], SEC[2]-SEC[3] and SEC[6]-SEC[7], SEC[8]-SEC[9] and SEC[12]-SEC[13], SEC[10]-SEC[11] and SEC[14]-SEC[15]. Then the repairing circuit A30 selects the memory cells on the P-SCSLs of the P-RCSL A00R0_PS0 to replace the memory cells on the normal CSLs corresponding to the IOs IO[0:7]E1, IO[8:15]E1, IO[0:7]E2, and IO[8:15]E2 in the region RA00. Of course the defects can be repaired by programming A30 to select the memory cells both on the P_RCSLs A00R0_PS0 and A00R0_PS1 while the default value of the SA0 is not changed, but it costs 2 P_RCSLs more than changing the SA0 setting.

According to the similar manner, how to repair the faulty memory cell in the regions RA02-RA03 can be deduced, and therefore the copious description related will not be stated again. The defect herein is defined as the condition that the faulty memory cells in the same region are corresponding to the same column address. Therefore, in the embodiment of FIG. 8, the repairing circuits A30 or A40 can repair 4 defects in the different regions RA00-RA03, but due to the control of the selection signal SA0, the repairing circuit A30 or A40 can equivalently repair 4 defects in one of the regions RA00-RA03.

Figure 9:
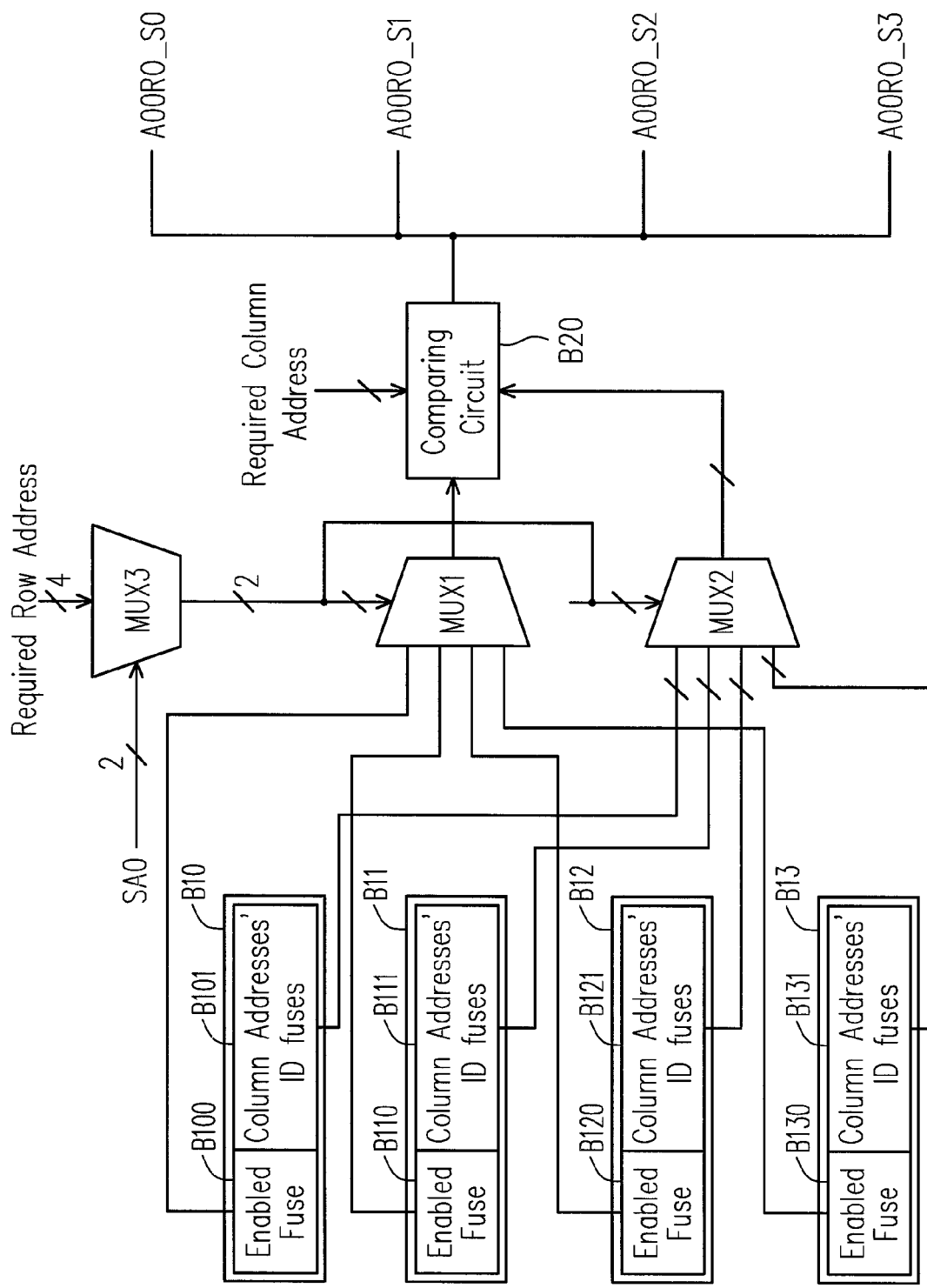
FIG. 9 is a block diagram showing a repairing circuit according to another one embodiment of the invention.

FIG. 9 is a block diagram showing a repairing circuit according to another one embodiment of the invention. The repairing circuit A30 comprises four partial RCS-FSs (abbreviated as "P-RCS-FSs") B10-B13, three multiplexers MUX1-MUX3, and a comparing circuit B20.

Each of the P-RCS-FSs B10-B13 respectively has one of enabled fuses B100-B130 and one set of the column addresses' ID fuses B101-B131. Each of the P-RCS-FSs B10-B13 has own ID which is used to identify which region it stands for.

For example, the P-RCS-FS B10 is responsible for the region RA00.

The multiplexer MUX3 receives a required row address which can decode both the row regions RA00-RA03 and the sections in each row region, and outputs part bits of the required row address according to a selection signal SA0 which can decide the sections in each row region. In the embodiment, the required row address has 4 bits, and the selection signal SA0 has 2 bits. The multiplexer MUX3 outputs 2 selected bits of the required row address according to the selection signal SA0. As mentioned above, the value of the selection signal SA0 may be changed, so as to increase the probability for repairing the defects.

The multiplexer MUX1 receives the enabled signals output from the enabled fuses B100, B110, B120, and B130. The multiplexer MUX1 outputs one of the enabled signals according to the 2 selected bits of the required row address.

The multiplexer MUX2 receives the column address signals output from column addresses' ID fuses B101, B111, B121, and B131. The multiplexer MUX2 outputs one set of the column address signals according to the 2 selected bits of the required row address.

The comparing circuit B20 receives the column address signals output from the multiplexer MUX2, the enabled signal output from the multiplexer MUX1, and the required column address which represents the column address of the at least one faulty memory cell on one of the normal CSLs corresponding to the IOs IO[0:7]E1, IO[8:15]E1, IO[0:7]E2, and IO[8:15]E2, and activates the P-RCSL of the SCSLs A00R0_S0-A00R0_S3 in the corresponding row region according to the column address signal output from the multiplexer MUX2, enabled signal output from the multiplexer MUX1, and the required column address.

For example, while the default value of the selection signal SA0 determines that the regions RA00 has the four sections SEC[0], SEC[4], SEC[8], and SEC[12], the region RA00 has the faulty memory cell on the normal column corresponding to the IO IO[0:7]E1, and thus the comparing circuit B20 receives the enabled signal output from the enabled fuse B100, the column address signal output from the column addresses' ID fuses B101, and the required column address, so as to activates the P-RCSL A00R0_PS0 of the SCSLs A00R0_S0-A00R0_S3 in region RA00 (i.e. the SCSLs A00R0_S0-A00R0_S3 in the sections SEC[0], SEC[4], SEC[8], and SEC[12] are activated). Therefore, the memory cells of the CSLs corresponding to the required column address in region RA00 are replaced by the memory cells of the P-RCSL A00R0_PS0 of the SCSLs A00R0_S0-A00R0_S3.

Though FIG. 9 merely illustrate the operations and structures of the repairing circuit A30, the operations and structures related the repairing circuit A40 can be deduced according to the description related to the repairing circuit A30, and therefore the copious description related will not be stated again.

Figure 10:
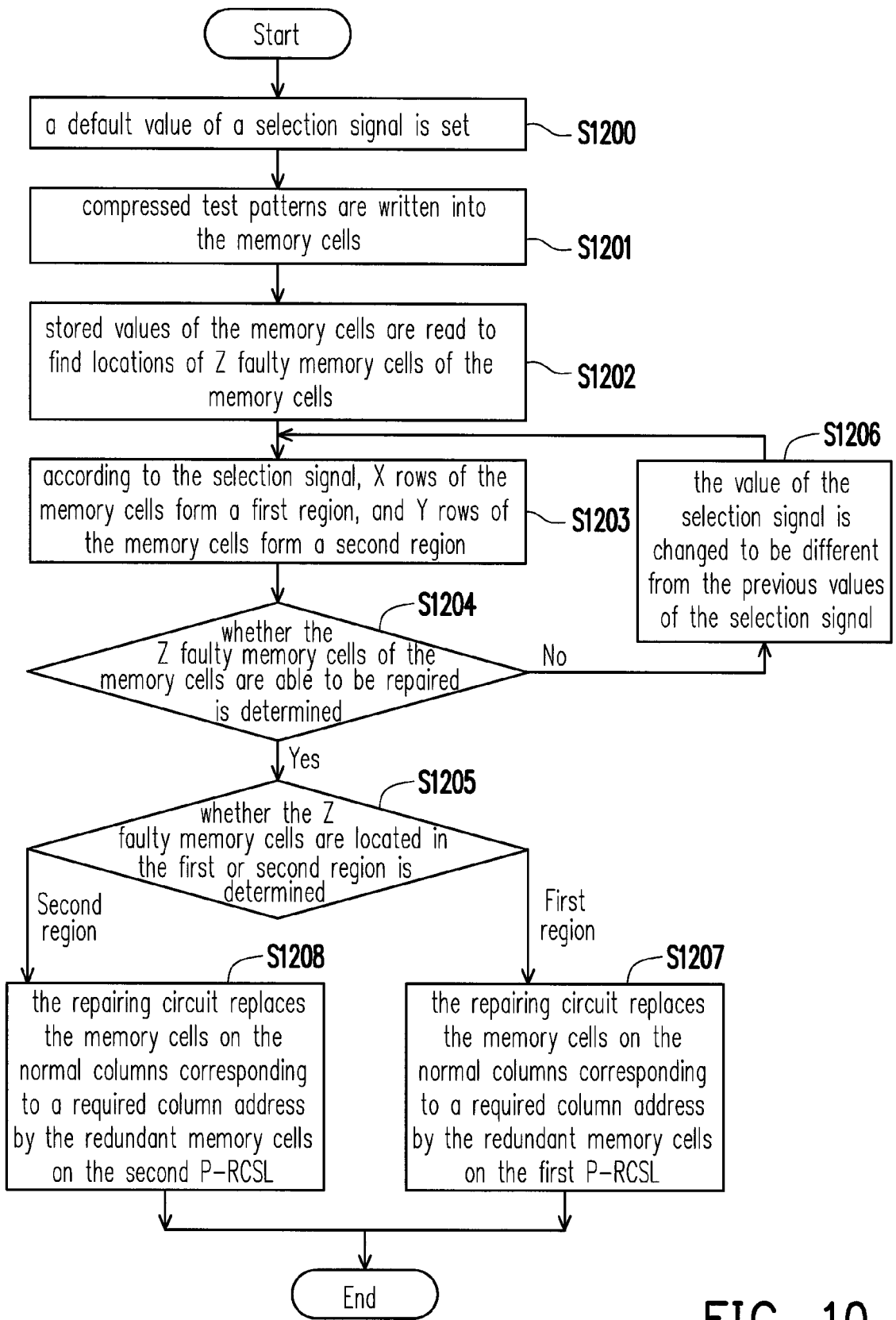
FIG. 10 is a flow chart showing a repairing method for a memory circuit according to one embodiment of the invention.

FIG. 10 is a flow chart showing a repairing method for a memory circuit according to one embodiment of the invention. The memory circuit comprises a plurality of columns with memory cells and at least one repairing circuit. The columns with memory cells comprise a plurality of normal CSLs with normal memory cells, and a first and second SCSLs of the redundant memory cells, wherein the first and second SCSLs are expanded from a RCSL. Each of the SCSL can be divided into several P-SCSLs in the different data blocks or row addresses.

At step S1200, a default value of a selection signal is set. At step S1201, compressed test patterns are written into the memory cells. At step S1202, stored values of the memory cells are read to find locations of Z faulty memory cells of the memory cells.

At step S1203, according to the selection signal, X rows of the memory cells form a first region, and Y rows of the memory cells form a second region, wherein X and Y are positive integer larger than 0, and the RCSL is divided into a first and second P-RCSLs respectively corresponding to the first and second region and having several P-SCSLs in the different row addresses.

At step S1204, whether the Z faulty memory cells of the memory cells are able to be repaired is determined, wherein Z is a positive integer. If that the Z faulty memory cells of the memory cells are able to be repaired, step S1205 will be executed; otherwise, step S1206 will be executed.

At step S1206, the value of the selection signal is changed to be different from the previous values of the selection signal, and after step S1206 is executed, the repairing method goes back to step S1203.

At step S1205, whether the Z faulty memory cells are located in the first or second region is determined. If the faulty memory cell is located in the first region, step S1207 is executed; if the faulty memory cell is located in the first region, step S1208 is executed.

At step S1207, the repairing circuit replaces the memory cells on the normal CSLs corresponding to a required column address by the redundant memory cells on the first P-RCSL, wherein the required column address is the column address which has the Z faulty memory cells.

At step S1208, the repairing circuit replaces the memory cells on the normal CSLs corresponding to a required column address by the redundant memory cells on the second P-RCSL, wherein the required column address is the column address which has the Z faulty memory cells.

To sum up, a novelty repairing method and circuit are provided by the embodiments of the present invention, wherein the IO compression manner can be used therein to reduce the access time during the CP1 test, and each RSCL can be divided into several P-RSCLs which are respectively responsible for repairing the defects of the corresponding regions. Based upon the repairing method, the memory circuit can reduce the number of the RCSLs. Furthermore, a variable region dividing manner is applied therein, so as to increase the probability for repairing the defect of the memory circuit.

Reference will now be made in detail to the present preferred embodiments of the invention, examples of which are illustrated in the accompanying drawings. Wherever possible, the same reference numbers are used in the drawings and the description to refer to the same or like parts.

What is claimed is:

1. A repairing method for a memory circuit, wherein the memory circuit comprises a plurality of columns with memory cells and at least one repairing circuit, the columns with memory cells comprise a plurality of normal CSLs with normal memory cells, and a first and second spare column selected lines (SCSLs) with redundant memory cells, wherein the first and second SCSLs are expanded from a redundant column selected line (RCSL), each of the SCSL is divided into several partial SCSLs (P-SCSLs) in different row addresses, the repairing method comprising:
    forming a first region having X rows of the memory cells, and a second region having Y rows of the memory cells, wherein X and Y are positive integer larger than 0, and the RCSL is divided into a first and second partial redundant column selected lines (P-RCSLs) respectively corresponding to the first and second region and having several P-SCSLs in the different row addresses;
    determining whether Z faulty memory cells are located in the first or second regions is determined, wherein Z is a positive integer larger than 0;
    if the Z faulty memory cells are located in the first region, the repairing circuit replaces the normal memory cells on the normal CSLs corresponding to a required column address by the redundant memory cells on the first P-RCSL, wherein the required column address is a column address which has the Z faulty memory cells; and
    if the Z faulty memory cells are located in the second region, the repairing circuit replaces the normal memory cells on the normal CSLs corresponding to the required column address by the redundant memory cells on the second P-RCSL.

2. The repairing method for the memory circuit according to claim 1, wherein the first and second regions are formed according to a selection signal.

3. The repairing method for the memory circuit according to claim 2, further comprising:
    setting a default value of the selection signal;
    whether the Z faulty memory cells of the memory cells are able to be repaired is determined; and
    if the Z faulty memory cells of the memory cells are not able to be repaired, a value of the selection signal is changed to be different from previous values of the selection signal, and the repairing method goes back to the step for forming a first and second region.

4. The repairing method for the memory circuit according to claim 1, further comprising:
    writing compressed test patterns into the memory cells; and
    reading compressed stored values of the memory cells find locations of the Z faulty memory cells of the memory cells.

5. The repairing method for the memory circuit according to claim 1, wherein X is equal to Y.

6. The repairing method for the memory circuit according to claim 3, wherein partial bits of row addresses corresponding to each of the X rows of the memory cells are identical, and partial bits of row addresses corresponding to each of the Y rows of the memory cells are identical.

7. A memory circuit, comprising:
    a plurality of columns with memory cells, wherein the columns with memory cells comprise a plurality of normal CSLs with normal memory cells, and a first and second SCSLs with redundant memory cells, the first and second SCSLs are expanded from a RCSL, each of the SCSL is divided into several P-SCSLs in different row addresses, a first region having X rows of the memory cells, and a second region having Y rows of the memory cells are formed, wherein X and Y are positive integer larger than 0, and the RCSL is divided into a first and second P-RCSLs respectively corresponding to the first and second region and having several P-SCSLs in the different row addresses; and
    at least one repairing circuit, coupled to the RCSL, if Z faulty memory cells are located in the first region, the repairing circuit replaces the normal memory cells on the normal CSLs corresponding to a required column address by the redundant memory cells on the first P-RCSL, if the Z faulty memory cells are located in the second region, the repairing circuit replaces the normal memory cells on the normal CSLs corresponding to the required column address by the redundant memory cells on the second P-RCSL, wherein the required column address is a column address which has the Z faulty memory cells, wherein Z is a positive integer larger than 0.

8. The memory circuit according claim 7, wherein the first and second regions are formed according to a selection signal.

9. The memory circuit according claim 7, wherein a default value of the selection signal is set, if the Z faulty memory cells of the memory cells are not able to be repaired, a value of the selection signal is changed to be different from previous values of the selection signal, and the repairing circuit tries to repair the Z faulty memory cells again.

10. The memory circuit according claim 7, wherein compressed test patterns are written into the memory cells, and stored values of the memory cells are read to find locations of the Z faulty memory cells of the memory cells.

11. The memory circuit according claim 7, wherein X is equal to Y.

12. The memory circuit according claim 7, wherein partial bits of row addresses corresponding to each of the X rows of the memory cells are identical, and partial bits of row addresses corresponding to each of the Y rows of the memory cells are identical.

13. The memory circuit according claim 7, wherein the repairing circuit comprising:
    a first partial redundant column selected fuse set (P-RCS-FS), corresponding to the first region, having a first enabled fuse and first column addresses ID fuses;
    a second P-RCS-FS, corresponding to the second region, having a second enabled fuse and second column addresses ID fuses;
    a first multiplexer, coupled to the first and second enabled fuses, for outputting one of enabled signals output from the first and second enabled fuse according to a required row address, wherein the required row address is a row address which has the Z faulty memory cells;
a second multiplexer, coupled to the first and second column addresses ID fuses, for outputting one of column address signals output from the first and second column addresses ID fuses according to the required row address; and
a comparing circuit, coupled to the first and second multiplexers, for activating the SCSLs of the first or the second P-RCSL according to the column address signal output from the second multiplexer, the enabled signal output from the first multiplexer, and the required column address.

14. The memory circuit according claim 13, wherein the repairing circuit further comprising:
a plurality of and gates, coupled to the comparing circuit, for receiving a hit signal and outputs of the comparing circuit.

15. The memory circuit according claim 12, wherein the repairing circuit comprising:
a first partial redundant column selected fuse set (P-RCS-FS), corresponding to the first region, having a first enabled fuse and first column addresses ID fuses;
a second P-RCS-FS, corresponding to the second region, having a second enabled fuse and second column addresses ID fuses;
a first multiplexer, coupled to the first and second enabled fuses, for outputting one of the enabled signals output from the first and second enabled fuse according to partial bits of a required row address, wherein the required row address is a row address which has the Z faulty memory cells;
a second multiplexer, coupled to the first and second column addresses ID fuses, for outputting one of the column address signals output from the first and second column addresses ID fuses according to the partial bits of the required row address;
a third multiplexer, for outputting the partial bits of the required row address signal according to the selection signal; and
a comparing circuit, coupled to the first and second multiplexers, for activating the SCSLs of the first or the second P-RCSL according to the column address signal output from the second multiplexer, the enabled signal output from the first multiplexer, and the required column address.

16. The memory circuit according claim 15, wherein the repairing circuit further comprising:
a plurality of and gates, coupled to the comparing circuit, for receiving a hit signal and outputs of the comparing circuit.

17. A repairing circuit for a memory circuit, the memory circuit comprises a plurality of columns of memory cells, wherein the columns of the memory cells comprise a plurality of normal columns of normal memory cells, and a first and second SCSLs of redundant memory cells, the first and second SCSLs are expanded from a RCSL, each of the SCSL is divided into several P-SCSLs in different row addresses, a first region having X rows of the memory cells, and a second region having Y rows of the memory cells are formed, wherein X and Y are positive integer larger than 0, and the RCSL is divided into a first and second P-RCSLs respectively corresponding to the first and second region and having several P-SCSLs in the different row addresses, and the repairing circuit comprising:
a first partial redundant column selected fuse set (P-RCS-FS), corresponding to the first region, having a first enabled fuse and first column addresses ID fuses;
a second P-RCS-FS, corresponding to the second region, having a second enabled fuse and second column addresses ID fuses;
a first multiplexer, coupled to the first and second enabled fuses, for outputting one of enabled signals output from the first and second enabled fuse according to a required row address, wherein the required row address is a row address which has the Z faulty memory cells, wherein Z is a positive integer larger than 0;
a second multiplexer, coupled to the first and second column addresses ID fuses, for outputting one of column address signals output from the first and second column addresses ID fuses according to the required row address; and
a comparing circuit, coupled to the first and second multiplexers, for activating the SCSLs of the first or the second P-RCSL according to the column address signal output from the second multiplexer, the enabled signal output from the first multiplexer, and the required column address.

18. The repairing circuit for the memory circuit according claim 17, further comprising:
a third multiplexer, for outputting partial bits of the required row address signal according to the selection signal, wherein the partial bits of the required row address signal are input to the first and second multiplexers.

19. The repairing circuit for the memory circuit according claim 17, further comprising:
a plurality of and gates, coupled to the comparing circuit, for receiving a hit signal and outputs of the comparing circuit.

* * * * *